United States Patent
Chen et al.

(10) Patent No.: US 8,438,797 B2
(45) Date of Patent: May 14, 2013

(54) OUTER FRAME DRAINAGE STRUCTURE OF CONCENTRATOR TYPE SOLAR CELL MODULE

(75) Inventors: Chun-Yi Chen, Taoyuan (TW); Hwa-Yuh Shin, Taoyuan (TW); Hung-Sheng Chiu, Taoyuan (TW)

(73) Assignee: Institute of Nuclear Energy Research, Atomic Energy Council, Executive Yuan, Longtan Township, Taoyuan County (TW)

( * ) Notice: Subject to any disclaimer, the term of this patent is extended or adjusted under 35 U.S.C. 154(b) by 558 days.

(21) Appl. No.: 12/647,423

(22) Filed: Dec. 25, 2009

(65) Prior Publication Data
US 2011/0154749 A1   Jun. 30, 2011

(51) Int. Cl.
*E04D 13/18* (2006.01)
*F24J 2/46* (2006.01)

(52) U.S. Cl.
USPC ............. 52/173.3; 52/209; 126/621; 126/623

(58) Field of Classification Search .................. 52/302.1, 52/302.3, 302.4, 302.6, 173.3, 209; 126/621–623
See application file for complete search history.

(56) References Cited

U.S. PATENT DOCUMENTS

| | | | | |
|---|---|---|---|---|
| 3,218,101 A * | 11/1965 | Adams | ........................ | 296/35.1 |
| 5,860,257 A * | 1/1999 | Gerhaher et al. | ............... | 52/235 |
| 2007/0289231 A1* | 12/2007 | Nevins | ......................... | 52/204.5 |
| 2008/0092456 A1* | 4/2008 | Millett et al. | ........................ | 52/1 |
| 2008/0302356 A1* | 12/2008 | Shin et al. | ..................... | 126/704 |
| 2012/0117901 A1* | 5/2012 | Loyd | .............................. | 52/235 |

* cited by examiner

*Primary Examiner* — William Gilbert
(74) *Attorney, Agent, or Firm* — Cheng-Ju Chiang

(57) ABSTRACT

An outer frame drainage structure of a concentrator type solar cell module, wherein, a drainage element having a predetermined height is disposed between a side board and a frame edge, hereby keeping a drainage slit between said side board and the corresponding frame edge, so that moisture will not remain inside the concentrator type solar cell module, thus the concentrator type solar cell module is able to operate in an optimal light-to-electricity conversion efficiency. In a structure mentioned above, a concave slit is formed through engaging and positioning an extended and bent positioning portion of the side board into a positioning slot of the frame edge, and the concave slit is linked to the drainage slit, thus facilitating exit of moisture and preventing intrusion of foreign objects effectively.

10 Claims, 6 Drawing Sheets

OUTER FRAME DRAINAGE STRUCTURE OF CONCENTRATOR TYPE SOLAR CELL MODULE

BACKGROUND OF THE INVENTION

1. Field of the Invention

The present invention relates to a concentrator type solar cell module, and in particular to an outer frame drainage structure of concentrator type solar cell module.

2. The Prior Arts

Presently, among the energy regeneration systems, the high concentrated photovoltaic (HCPV) electricity generation system has excellent potential for further development, due to its various advantages of material saving, reduced cost and high efficiency in generating electricity. As such, it is generally regarded as ideal to be used in building solar energy power plant, and thus it has a promising future in the solar energy industry.

Refer to FIG. 1 for a schematic diagram of a concentrator type solar cell module according to the prior art. As shown in FIG. 1, the concentrator type solar cell module includes: an upper frame 12; a lower frame 13, four angle columns 15; four side boards 14; a concentrator lens 11, carried and supported on the upper frame 12; and a solar cell unit and a heat dissipation module constituting the solar cell components are disposed in an inner space formed and surrounded by the upper frame 12, the lower frame 13, the angle columns 15, and the side boards 14. The concentrator lens 11 is capable of concentrating and focusing the solar light onto solar cell unit in the inner space, thus generating electricity for outputting it to the various equipment as required. Also, a heat dissipation module is provided to dissipate heat generated in the process. As such, through this kind of arrangement mentioned above, the number of solar cell units utilized can be reduced, hereby reducing the cost of equipment required.

Moreover, refer to FIG. 2 for a schematic diagram of a frame structure of a concentrator type solar cell module according to the prior art at the same time. As shown in FIG. 2, in this frame structure, the upper frame 12 and the lower frame 13 are provided respectively with positioning slots 121 and 131 respectively, so that the side board 14 can be engaged and positioned into the positioning slots 121 and 131 through the positioning portions 141 and 142 extended and bent on two sides of the side board, such that the side board 14 is fixed and pressed tightly to the upper and lower frames 12 and 13. Since there exist no slits or spacings between side boards 14 and the upper and lower frames 12 and 13, therefore, after rain fall, moisture tends to remain inside the concentrator type solar cell module, and in particular on the inner side of the concentrator lens 11, thus resulting in the reduction of light-to-electricity conversion efficiency and the electricity generated, and the increase of production cost of concentrator type solar cell module. Therefore, presently, the performance and effectiveness of this kind of design is not quite satisfactory.

In view of the problems and shortcomings of the prior art, the present invention provides concentrator type solar cell module, so as to solve the afore-mentioned problems of the prior art.

SUMMARY OF THE INVENTION

A major objective of the present invention is to provide an outer frame drainage structure of concentrator type solar cell module, wherein, a drainage spacing or slit is arranged between a side board and a frame, such that moisture is prevented from remaining inside the concentrator type solar cell module, and the concentrator type solar cell module is able to operate at its optimal light-to-electricity conversion efficiency in achieving its maximum electricity generation, hereby solving the drawbacks of the prior art in this respect.

Another objective of the present invention is to provide an outer frame drainage structure of a concentrator type solar cell module, wherein, a drainage slit is provided between a side board and a frame by utilizing the height of a drainage element, such that a concave slit leading to the draining slit is formed between the side board and the positioning slot of the frame, so as to facilitate exit of moisture, and prevent the intrusion of foreign objects effectively.

In order to achieve the above-mentioned objective, the present invention provides an outer frame drainage structure of a concentrator type solar cell module, consisting mainly of two frames, at least four side boards and a plurality of drainage elements, wherein, the frame is composed of four frame edges to form a rectangle-shaped body, the two frames are arranged parallel to each other in an upper and lower configuration, and the four side boards are disposed surrounding and fixed to the frames, hereby forming an inner space. The drainage elements are designed to have a predetermined height, and is located between the side board and the frame, such that a drainage slit is kept between the side board and the frame, thus the moisture in the inner space can be exited though the drainage slit without remaining in the inner space.

Furthermore, positioning slots are provided in a frame for the engaging and positioning of the extended and bent positioning portions of the side board, and the drainage slit between a frame and a side board created by the drainage element will cause a concave slit to be formed between a positioning slot and a positioning portion, such that the drainage slit is linked to the concave slit, hereby facilitating exit of moisture and preventing intrusion of foreign objects.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the present invention will become apparent to those skilled in the art from this detailed description.

BRIEF DESCRIPTION OF THE DRAWINGS

The related drawings in connection with the detailed description of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 1:
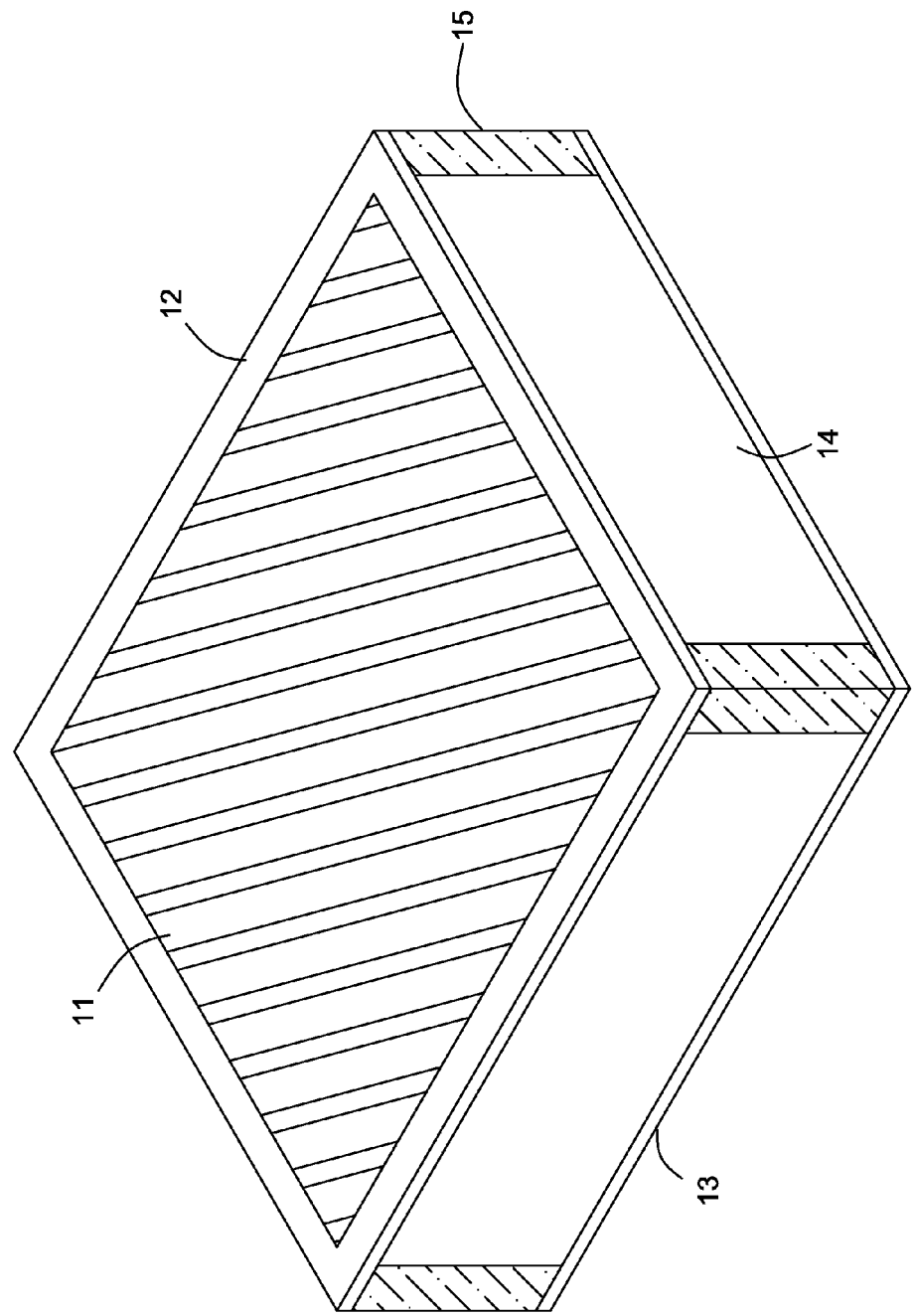
FIG. 1 is a schematic diagram of a concentrator type solar cell module according to the prior art.
Figure 2:
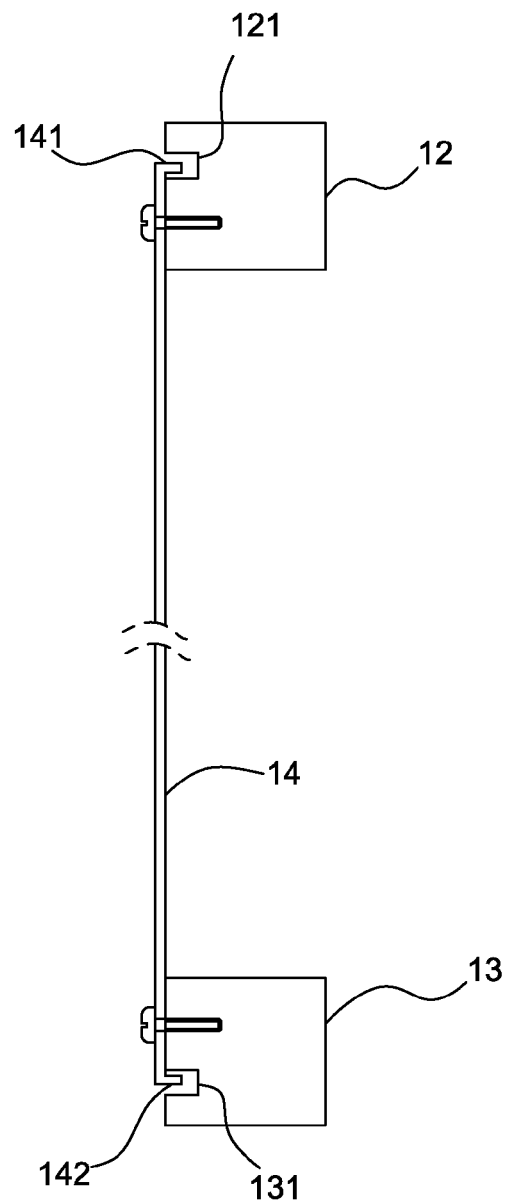
FIG. 2 is a schematic diagram of a frame structure of a concentrator type solar cell module according to the prior art.
Figure 3:
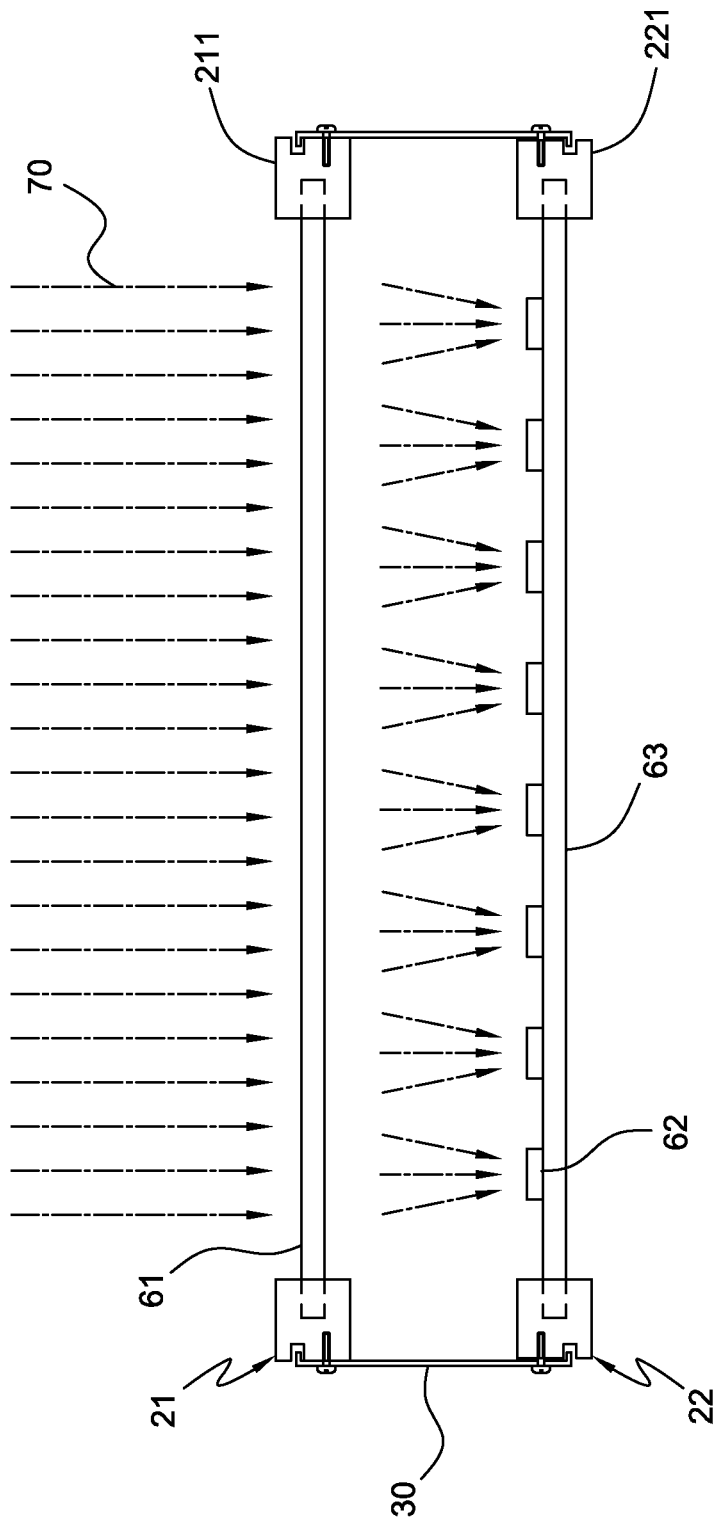
FIG. 3 is a schematic diagram of a concentrator type solar cell module according to the present invention.
Figure 4:
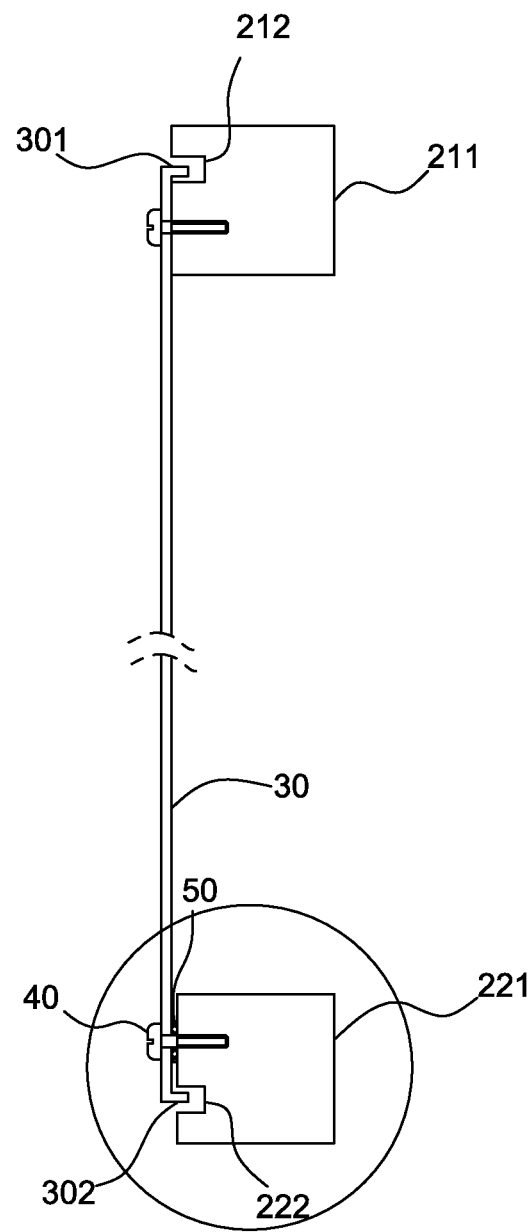
FIG. 4 is a schematic diagram of an outer frame drainage structure of a concentrator type solar cell module according to the present invention.

Refer to FIG. 3 for a schematic diagram of a concentrator type solar cell module according to the present invention, and FIG. 4 for a schematic diagram of an outer frame drainage structure of a concentrator type solar cell module according to the present invention. As shown in FIGS. 3 & 4, the outer frame drainage structure of the concentrator type solar cell module includes two frames (an upper frame 21 and a lower frame 22 respectively), four side boards 30 (refer to FIG. 1 at the same time), and a plurality of drainage elements 50.

The upper frame 21 and the lower frame 22 are arranged parallel to each other in an upper and lower configuration, and both are composed of four frame edges 211 and 221 to form a rectangle-shaped body. The upper and lower sides of each side boards 30 are fixed into the corresponding frame edges 211 and 221 of the upper frame 21 and lower frame 22 respectively, thus forming and enclosing an inner space for the disposition and installation of solar cell units 62; meanwhile, the upper frame 21 and lower frame 22 are used to carry and support the concentrator lens array 61 and the heat dissipation module 63 with solar cell units 62 disposed thereon.

In the structure mentioned above, the concentrator lens array 61 can be a Fresnel lens array, made of material of superior optical characteristics, such as light transmission resin of PPMA, PC, or PE, and its structure is a saw-tooth mirror on its lower side having outward incrementing angles, and its texture is designed and created by utilizing light interference, light diffraction, and light receiving angles. In an ordinary design, its focal length is 1 mm~100 cm, with a light concentration ratio of 2×~1000×. The solar cell unit 62 can be a III-V Semiconductor solar cell, and is arranged corresponding to the concentrator lens array 61, so as to absorb the sun light 70 focused through the concentrator lens array 61, and then convert the sun light 70 thus absorbed into electricity for outputting it to the equipment as required. Compared with an ordinary silicon solar cell, the III-V Semiconductor solar cell is able to absorb sun light of wider spectrum, thus its light-to-electricity conversion efficiency can be raised significantly.

Moreover, the heat dissipation module 63 is designed to have superior heat dissipation function and solar cell unit 62 carrying and supporting capabilities, and it can be made of materials of superior heat dissipation as selected from a group consisting of: Ag, Cu, Al, Ni, Au, and the alloys thereof. Therefore, the high temperature generated by the solar cell unit 62 through absorbing the concentrated sun light as focused by the concentrator lens array 61 can be dissipated into the ambient air, through the heat dissipation module 63 located at the bottom of the solar cell units 62, such that the solar cell units 62 may operate in suitable temperature, thus prolonging its service life.

Subsequently, refer to FIG. 4 for a schematic diagram of an outer frame drainage structure of a concentrator type solar cell module according to the present invention. As shown in FIG. 4, the frame edges 211 and 221 of the upper frame 21 and lower frame 22 are provided respectively with the positioning slots 212 and 222 for the engaging and fixing of the extended and bent positioning portions 301 and 302 at two sides of the side board 30, so that the side board 30 can be fixed tightly into the frame edges 211 and 221 of the upper frame 21 and the lower frame 22, and a fixing element 40 is designed to penetrate through the frame edges 211 and 221 and side board 30 to fix the upper frame 21, the lower frame 22, and the side board 30 together. A drainage element 50 having a predetermined height is disposed between side board 30 and frame edge 221, so as to keep a drainage slit between the side board 30 and the frame edge 221 of the lower frame 22, thus moisture inside the solar cell module can exit through the drainage slit. Though in the drawing it is shown that the drainage element 50 is located in the corresponding position of the lower frame 22, however, it can also be disposed in the upper frame 21, or it can be disposed in both the upper frame 21 and the lower frame 22.

Finally, refer to FIGS. 5A to 5D for schematic diagrams of drainage element utilized in an outer frame drainage structure of a concentrator type solar cell module according to the present invention.

As shown in FIGS. 5A to 5D, the fixing element 40 can be of a screw type, screwed and fixed in the side board 30 and frame edge 221 of the lower frame 22, however, the present invention is not limited to this, other types of fixing element such as rivet, pin, fastener can also be utilized. The drainage element 50 can be of a washer type (refer to FIG. 5A), sleeved around the outer perimeter of the fixing element 40, and is held by the fixing element 40 to be sandwiched and pressed between the side board 30 and frame edge 221. As such, when the positioning position 302 is engaged and positioned in the positioning slot 222, a concave slit is formed in the positioning slot 222 and is linked to the drainage slit, thus facilitating exit of moisture from the inner space and preventing intrusion of foreign objects into the inner space.

Figure 5A:
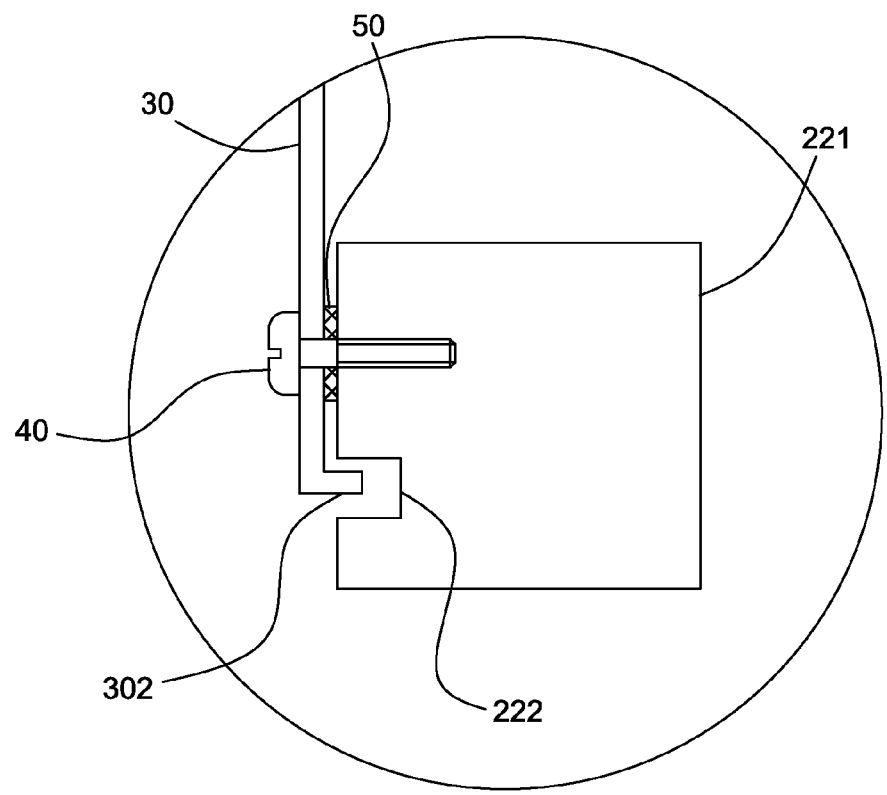
FIGS. 5A to 5D are schematic diagrams of drainage element utilized in an outer frame drainage structure of a concentrator type solar cell module according to the present invention.
Figure 5B:
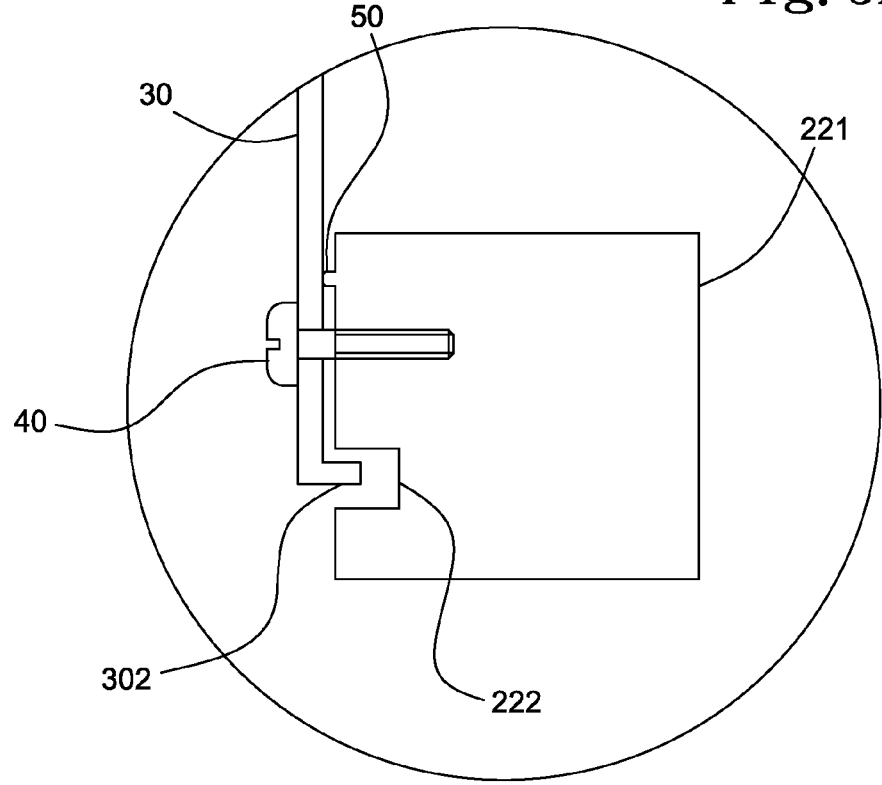
Figure 5C:
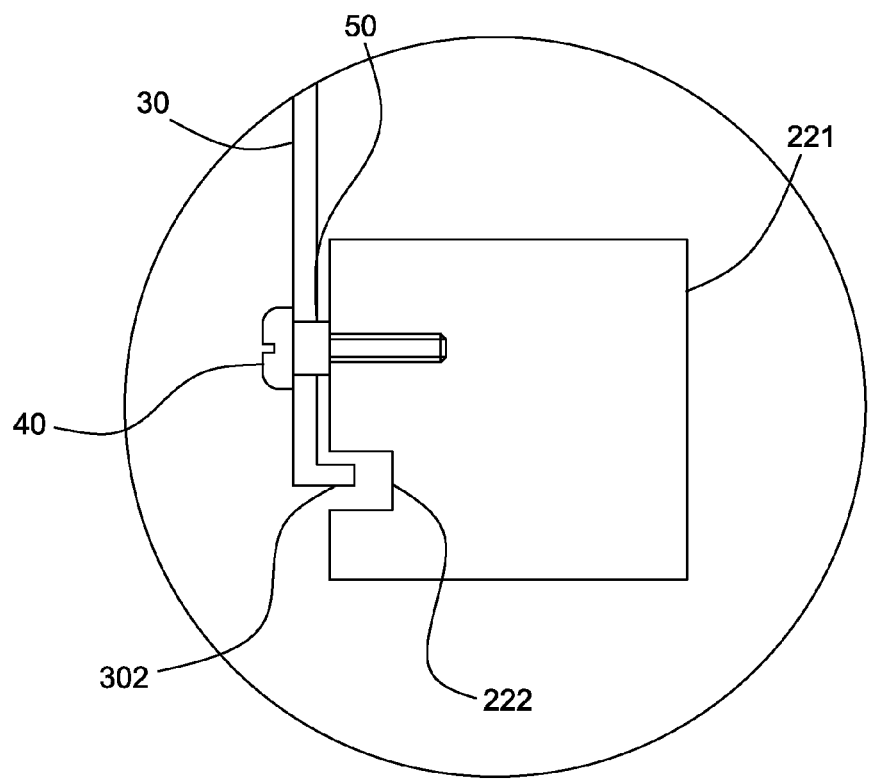
Figure 5D:
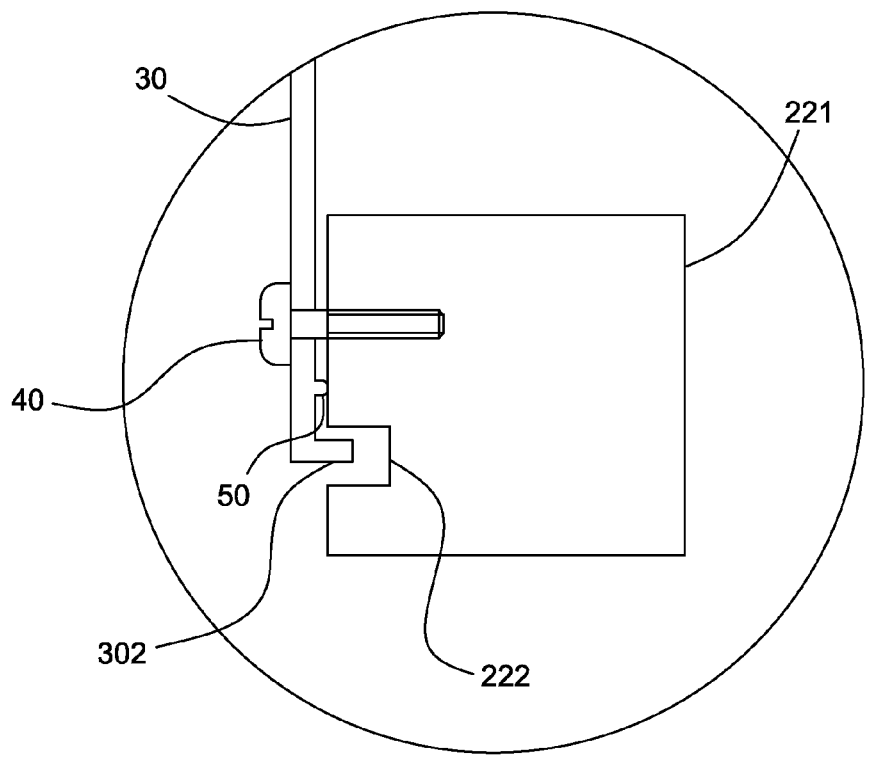

Another type of drainage element 50 can be a protrusion structure extending from the side board 30 to the frame edge 221 and is pressed against the frame edge 221 (refer to FIG. 5B); or, alternatively, the drainage element 50 can be a protrusion structure extending from the frame edge 221 to the side board 30 and is pressed against the side board 30 (refer to FIG. 5D). Of course, the drainage element 50 can also be a conventional element such as a shoulder screw (refer to FIG. 5C), that is designed to have a thread-less elongation portion above the threaded portion, which can also achieve the purpose of forming a drainage slit for exiting moisture inside the solar cell module.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. An outer frame drainage structure of a concentrator type solar cell module, comprising:
    two frames, arranged parallel to each other in an upper and lower configuration, and both are rectangle-shaped bodies formed respectively with four frame edges;
    at least four side boards adjacent to each other, an upper and a lower side of each side board are fixed respectively into said corresponding frame edges of said frame, thus forming and surrounding an inner space; and
    a drainage element, having a predetermined height and disposed between said side board and said frame edge, so as to keep a drainage slit between said side board and said corresponding frame edge, thus moisture in said inner space is exited through said drainage slit.

2. The outer frame drainage structure of a concentrator type solar cell module as claimed in claim 1, further comprising:
    a plurality of fixing elements, used to penetrate said side board and said frame edge, so as to make said side board and said frame edge pressed and held to each other tightly.

3. The outer frame drainage structure of a concentrator type solar cell module as claimed in claim 2, wherein
said fixing element is a fixing screw, used to fasten and hold said side board to said frame edge.

4. The outer frame drainage structure of a concentrator type solar cell module as claimed in claim 3, wherein
said drainage element is a washer, sleeved around an outer perimeter of said fixing screw, and is held by said fixing screw to be sandwiched and pressed between said side board and said frame edge.

5. The outer frame drainage structure of a concentrator type solar cell module as claimed in claim 3, wherein
said fixing screw is a shoulder screw.

6. The outer frame drainage structure of a concentrator type solar cell module as claimed in claim 1, wherein
said frame edge is provided with a positioning slot, and said side board is provided with extended and bent positioning portions corresponding to said positioning slots, for engaging and positioning said positioning portions into said positioning slots.

7. The outer frame drainage structure of a concentrator type solar cell module as claimed in claim 6, wherein
when said positioning portion is engaged and positioned into said positioning slot, a concave slit is formed in said positioning slot, and is linked to said drainage slit in facilitating exit of moisture from said inner space and preventing intrusion of foreign objects into said inner space.

8. The outer frame drainage structure of a concentrator type solar cell module as claimed in claim 1, wherein
said drainage element is a protrusion structure extending from said side board to said frame edge and is pressed against said frame edge.

9. The outer frame drainage structure of a concentrator type solar cell module as claimed in claim 1, wherein
said drainage element is a protrusion structure extending from said frame edge to said side board and is pressed against said side board.

10. An outer frame drainage structure of a concentrator type solar cell module, comprising:
two frames, arranged parallel to each other in an upper and lower configuration, and both are rectangle-shaped bodies formed respectively with four frame edges;
at least four side boards adjacent to each other, an upper and a lower side of each side board are fixed respectively into said corresponding frame edges of said frame, thus forming and surrounding an inner space; and
a drainage element, having a predetermined height and disposed between said side board and said frame edge, so as to keep a drainage slit between said side board and said corresponding frame edge, thus moisture in said inner space is exited through said drainage slit; wherein
said frame edge is provided with a positioning slot, and said side board is provided with extended and bent positioning portions corresponding to said positioning slots for engaging and positioning said positioning portions into said positioning slots; and
when said positioning portion is engaged and positioned into said positioning slot, a concave slit is formed beside said positioning portion in said positioning slot, and is linked to said drainage slit in facilitating exit of moisture from said inner space and preventing intrusion of foreign objects into said inner space.

* * * * *